(12) United States Patent
Behin et al.

(10) Patent No.: US 6,888,979 B2
(45) Date of Patent: May 3, 2005

(54) MEMS MIRRORS WITH PRECISION CLAMPING MECHANISM

(75) Inventors: Behrang Behin, Berkeley, CA (US); Michael J. Daneman, Pacifica, CA (US); Chuang-Chia Lin, San Pablo, CA (US); Boris Kobrin, San Francisco, CA (US); Murali Chaparala, Vancouver, WA (US); Gary Zalewski, Oakland, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/834,744

(22) Filed: Apr. 12, 2001

(65) Prior Publication Data

US 2002/0064337 A1 May 30, 2002

Related U.S. Application Data

(60) Provisional application No. 60/250,081, filed on Nov. 29, 2000.

(51) Int. Cl.$^7$ ............................................... G02B 6/26
(52) U.S. Cl. ...................... 385/18; 385/17; 359/872; 359/876
(58) Field of Search ............................ 150/118; 385/18, 385/17; 359/872, 876, 877

(56) References Cited

U.S. PATENT DOCUMENTS

| | | | |
|---|---|---|---|
| 4,580,873 A | 4/1986 | Levinson | 350/96.2 |
| 4,674,828 A | 6/1987 | Takahashi et al. | 350/96.13 |
| 5,043,043 A | 8/1991 | Howe et al. | 156/645 |
| 5,206,983 A | 5/1993 | Guckel et al. | 29/598 |
| 5,327,033 A | 7/1994 | Guckel et al. | 310/40 |
| 5,629,918 A | 5/1997 | Ho et al. | 369/112 |
| 5,637,539 A | 6/1997 | Hofmann et al. | 438/20 |
| 5,638,946 A | 6/1997 | Zavracky | 200/181 |

(Continued)

FOREIGN PATENT DOCUMENTS

| | | | |
|---|---|---|---|
| EP | 1120677 | 8/2001 | G02B/26/02 |
| WO | 9634417 | 10/1996 | H01L/29/00 |
| WO | 0057233 | 9/2000 | G02B/26/00 |

OTHER PUBLICATIONS

Storment, C.. Flexible, Dry–Released Process for Aluminum Electrostatic Actuators, Sept. 1994, pp. 90–96.

(Continued)

Primary Examiner—Edward J. Glick
Assistant Examiner—Elizabeth Keaney
(74) Attorney, Agent, or Firm—JDI Patent; Joshua D. Isenberg

(57) ABSTRACT

A microelectromechanical (MEMS) apparatus has a base and a flap with a portion coupled to the base so that the flap may move out of the plane of the base between first and second position. The base may have a cavity with largely vertical sidewalls that contact a portion of the flap when the flap is in the second position Electrodes may be placed on the vertical sidewalls and electrically isolated from the base to provide electrostatic clamping of the flap to the sidewall. The base may be made from a substrate portion of a silicon-on-insulator (SOI) wafer and the flap defined from a device layer of the SOI wafer. The flap may be connected to the base by one or more flexures such as torsional beams. An array of one or more of such structures may be used to form an optical switch.

24 Claims, 6 Drawing Sheets

U.S. PATENT DOCUMENTS

| | | | |
|---|---|---|---|
| 5,644,177 A | 7/1997 | Guckel et al. | 310/40 |
| 5,645,684 A | 7/1997 | Keller | 156/643.1 |
| 5,646,464 A | 7/1997 | Sickafus | 310/40 |
| 5,717,631 A | 2/1998 | Carley et al. | 365/174 |
| 5,719,073 A | 2/1998 | Shaw et al. | 437/228 |
| 5,770,465 A | 6/1998 | MacDonald et al. | 437/67 |
| 5,839,722 A | 11/1998 | Berlin et al. | 271/265.02 |
| 5,866,281 A | 2/1999 | Guckel et al. | 430/22 |
| 5,881,598 A | 3/1999 | Sapuppo et al. | 74/5.6 E |
| 5,881,787 A * | 3/1999 | Davis et al. | 150/103 |
| 5,908,719 A | 6/1999 | Guckel et al. | 430/5 |
| 5,914,507 A | 6/1999 | Polla et al. | 257/254 |
| 5,929,542 A | 7/1999 | Ohnstein et al. | 310/40 |
| 5,943,155 A | 8/1999 | Goossen | 359/247 |
| 5,945,898 A | 8/1999 | Judy et al. | 335/78 |
| 5,949,571 A | 9/1999 | Goossen et al. | 359/291 |
| 5,959,338 A | 9/1999 | Youngner et al. | 257/419 |
| 5,960,255 A | 9/1999 | Bartha et al. | 438/14 |
| 5,963,788 A | 10/1999 | Barron et al. | 438/48 |
| 5,971,355 A | 10/1999 | Biegelsen et al. | 251/129.06 |
| 6,074,890 A | 6/2000 | Yao et al. | 438/52 |
| 6,094,293 A | 7/2000 | Yokoyama et al. | 359/280 |
| 6,121,552 A | 9/2000 | Brosnihan et al. | 174/25.3 |
| 6,256,430 B1 * | 7/2001 | Jin et al. | 385/18 |
| 6,360,036 B1 * | 3/2002 | Couillard | 385/19 |
| 6,396,975 B1 * | 5/2002 | Wood et al. | 385/18 |
| 6,538,799 B2 | 3/2003 | McClelland et al. | 359/291 |

OTHER PUBLICATIONS

Behrang Behin et al., "Magnetically Actuated Micromirrors for Fiber–Optic Switching", 6/8–6/11, p. 273–276.

Behrang Behin et al., Application for United States Letters Patent, Feb. 23, 2000.

Provisional Patent Application of Behrang Behin et al., "Global Mechanical Stop for Precise Positioning of a Field of Mirrors", filed Mar. 9, 1999.

L.Y. Lin, et al, Free Space Micromachined Optical Switches with Submillisecond Switching Time for Large–Scale Optical Crossconnects, IEEE Photonics Technology Letters, vol. 10, No. 4, Apr. 1998.

U.S. patent application Ser. No. 09/489,264 of Robert L. Wood et al, "MEMS Optical Cross–Connect Switch", filed Jan. 21, 2000.

* cited by examiner

MEMS MIRRORS WITH PRECISION CLAMPING MECHANISM

CROSS-REFERENCE TO RELATED APPLICATION

This application is based on and claims priority from Provisional application 60/250,081 filed Nov. 29, 2000.

FIELD OF THE INVENTION

This invention relates generally to microelectromechanical structures (MEMS). More particularly, it relates to a clamping mechanism for MEMS apparatus.

BACKGROUND OF THE INVENTION

MEMS free-space optical switches can be categorized into two major branches: the planar matrix (2-dimensional) approach, and the beam-steering (3-dimensional) approach. The 2D approach typically involves mirrors that move between on and off position. The angular accuracy at the on position is extremely critical as it affects the alignment of the mirror and optical loss of the switch.

Using <110> silicon with anisotropic etchants, one can form trenches with 90-degree sidewalls. If one bonds this wafer to another wafer that has free rotating mirrors, the sidewall can serve as a reference stopping plane to fix the up- mirrors in a vertical position. In addition, the sidewall may also serve as an electrode for electrostatically clamping the mirror in the vertical position.

One type of optical switch employs microelectromechanically-actuated mirrors. FIG. 1 depicts one type of MEMS actuated switch 100 that is made using 2 substrates. A top chip 101 containing a sidewall for receiving a movable mirror 111 is bonded to a bottom chip 102 containing a base 103. There are a few complications associated with the two-wafer approach. The attachment process requires a very high accuracy aligner-bonder. Moreover, the two-chip process places certain geometrical constraints that limit the minimum geometry of the trenches and mirrors. Furthermore, the complexity of the fabrication and alignment process can increase cost and reduce yield.

Therefore, there is a need in the art for a low-cost, high-yield scalable switch and a process of fabricating same.

SUMMARY OF THE INVENTION

The disadvantages associated with the prior art may be overcome by a microelectromechanical (MEMS) apparatus having a base and a flap with a bottom portion coupled to the base so that the flap may move out of the plane of the base between first and second angular orientations. An array of one or more of such structures may be used to form an optical switch. The base may have an opening with largely vertical sidewalls containing one or more electrodes. The sidewalls contact a portion of the flap when the flap is in the second angular orientation. The electrodes may be electrically isolated from the base. The flap may include a magnetic material so that the flap moves in response to an external magnetic field. A voltage source may be coupled between the flap and the sidewall electrode to apply an electrostatic force between the sidewall electrode and the flap such that the flap assumes the angular orientation of the sidewall. The electrostatic force may be sufficient to prevent the flap from changing position in the presence of an applied magnetic field. The apparatus may further include an electrode on the base and a voltage source coupled between the electrode in the base and the flap to apply an electrostatic force between the electrode in the base and the flap. The base may be made from a substrate portion of a silicon-on-insulator (SOI) wafer and the flap defined from a device layer of the SOI wafer. The flap may be connected to the base by one or more flexures such as torsional beams.

A MEMS apparatus of the type described above may be provided with one or more conductive landing pads on the underside of the flap that are electrically isolated from the flap. The landing pads may be electrically coupled to either the sidewall electrode or the base to reduce stiction and arcing. Alternatively, conductive landing pads may be provided on the sidewall or base that are equipotential with the flap.

DETAILED DESCRIPTION

Figure 1:
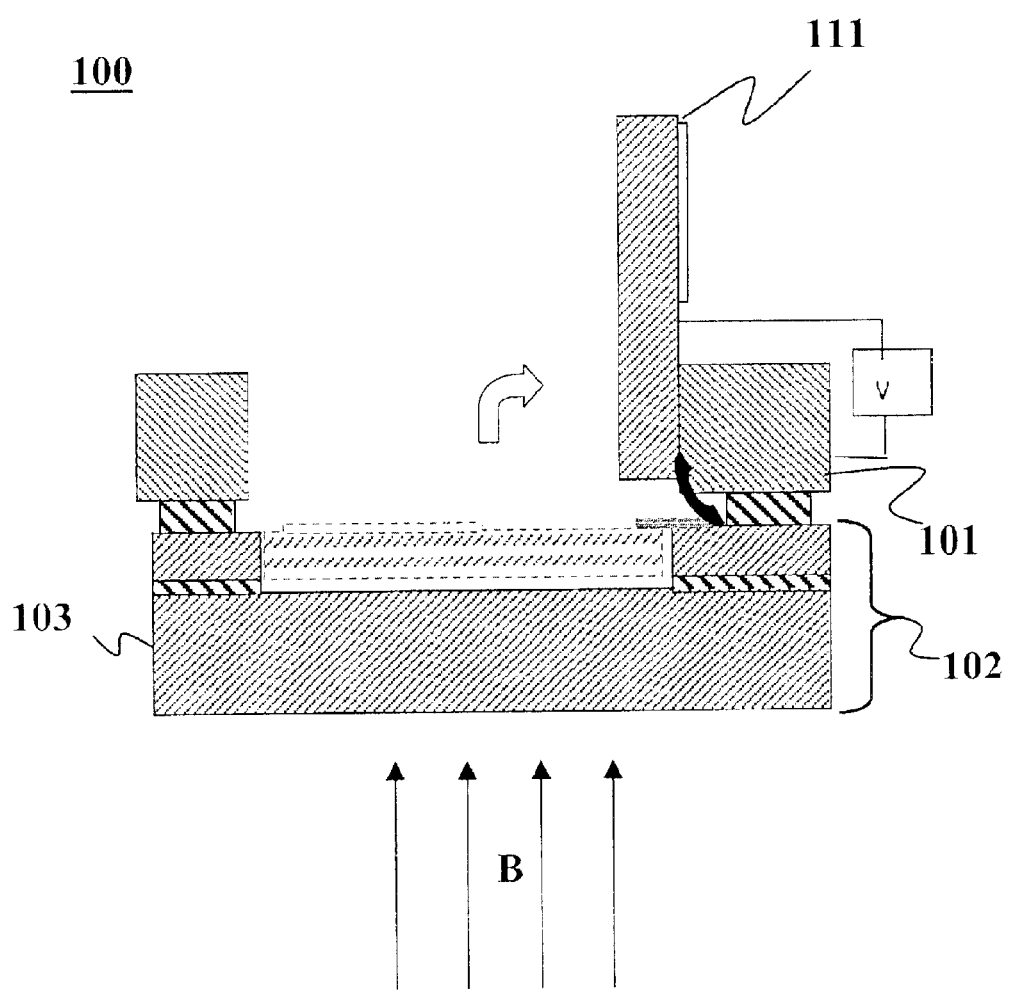
FIG. 1 is a cross-sectional schematic diagram of a MEMS mirror apparatus according to the prior art.
Figure 2A:
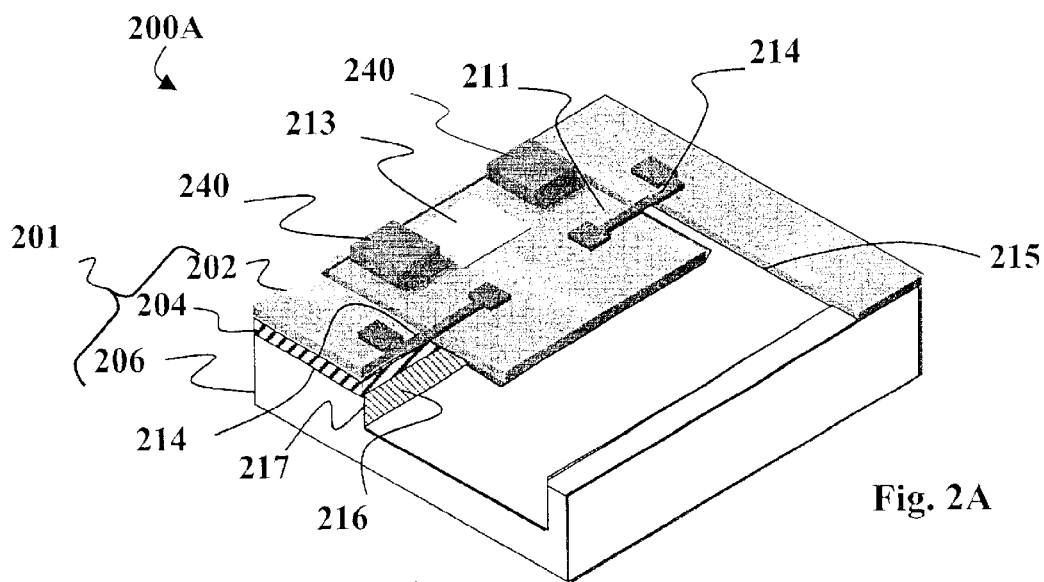
FIG. 2A is an isometric schematic drawing of a MEMS apparatus according to a first embodiment of the present invention.

A first embodiment of the invention is shown in FIG. 2A, which shows an apparatus 200 having a movable flap that can be precisely clamped by electrodes on either 0 or 90 degrees surfaces. Such a structure allows the flap to be clamped, for example, in either a vertical or horizontal position. Such a flap may be used as part of an array of several MEMS mirrors in a planar matrix switch.

The apparatus 200 generally comprises a base 206 and a flap 211 coupled to the base 206, e.g. by one or more flexures 214, so that the flap 211 is movable out of the plane of the base 206 from a first angular orientation to a second angular orientation. By way of example, the first position may be substantially horizontal, i.e., substantially parallel to a plane of the base, and the second position may be substantially vertical, i.e., substantially perpendicular to the plane of the base. The flap 211 may include a light-deflecting element 213 so that the apparatus 200 may operate as a MEMS optical switch. By way of example, the light-deflecting element 213 may be a simple plane reflecting (or partially reflecting) surface, curved reflecting (or partially reflecting) surface, prismatic reflector, refractive element, prism, lens, diffractive element, e.g. fresnel lens, a dichroic coated surface for wavelength specific and bandpass selectivity, or some combination of these. The flap 211 and the base 206 may be formed from a portion of a starting material 201 in order to avoid alignment problems associated with post-process bonding associated with a two wafer approach. For example, the starting material 201 may be formed from a silicon-on-insulator (SOI) wafer having a device layer 202, an insulator layer 204 and a substrate layer as the base 206. The starting material 201 may include an opening or cavity 215 having sidewalls 217 that are vertical, i.e., substantially perpendicular to a plane of the base 206. One or more of the sidewalls 217 may contain an electrode 216 that may be electrically isolated from the base 206. The flap 211, flexures 214, and sidewalls 217 may be positioned so that a bottom portion of the flap 211 contacts one of the sidewalls 217 when the flap 211 is in the second angular orientation such that the flap 211 may assume an orientation substantially parallel to that of the sidewall 217. A voltage applied between the electrode and the flap may attract the flap to the sidewall to secure the flap in place. Preferably, the flap 211 is attracted to the electrode 216 such that such that the flap 211 may assume the angular orientation of the sidewall 217.

Any conventional means may be used to provide an actuating force to move the flap 211. For example, the flap 211 may contain a magnetically active element 240 to facilitate movement of the flap by interaction with an externally applied magnetic field. The magnetically active element 240 may be a magnetically active material having, e.g. a fixed magnetic moment, i.e., it may be a permanent magnet. Magnetically active materials may include Nickel, Nickel-Iron, Iron-Cobalt, Aluminum-Nickel-Cobalt, Neodymium-Iron-Boron, etc., and, may be deposited in a uniform or stepped pattern.

The inventors have discovered that a stepped pattern of magnetically active material may be deposited to a movable flap such as the flap 211. It must be stated that a stepped magnetic material may be used with any moveable flap. The stepped pattern may increase the amount of torque applied to the flap when exposed to a magnetic field. For example, the thickness and/or profile of the magnetic material may be varied by sequentially depositing slabs of material of comparable thickness to produce a series of steps. The height of the steps may vary along a direction perpendicular to an axis of rotation of the flap. The stepped magnetic material may act as a guide for the magnetic field and thereby enhance the torque or force exerted on the flap by the field. The configuration of the steps may depend on the relative orientation of the magnetic field with respect to the flap and the rotation axis of the flap. By way of example, where the rotation axis is disposed along an edge of the flap and the magnetic field is perpendicular to both the rotation axis and a plane of the flap, e.g. the horizontal plane, to enhance the torque to rotate the flap upwards out of the horizontal plane the steps may rise away from the axis. In other words, portions of the magnetic material that are close to the axis are lower than portions that are further away. To enhance the torque for a downward rotation the steps may rise toward the rotation axis, i.e., portions of the magnetic material that are closer to the axis may be lower than portions that are further away.

The flexures 214 may apply a torsional, or restoring force that returns the flap 211 to the first position when the actuating force is removed. However, other restoring forces may be applied to flap 211 to return the flap to the first position. Such torque may be exerted on flap 211 by biasing mechanisms that operate via pneumatic, thermal, or magnetic principals, including coils that interact with an external magnetic field, electrostatic elements, such as gap closing electrodes, piezoelectric actuators and thermal actuators. Multiple restoring forces may also used together, and the forces may operate along the same or opposing directions.

Figure 2B:
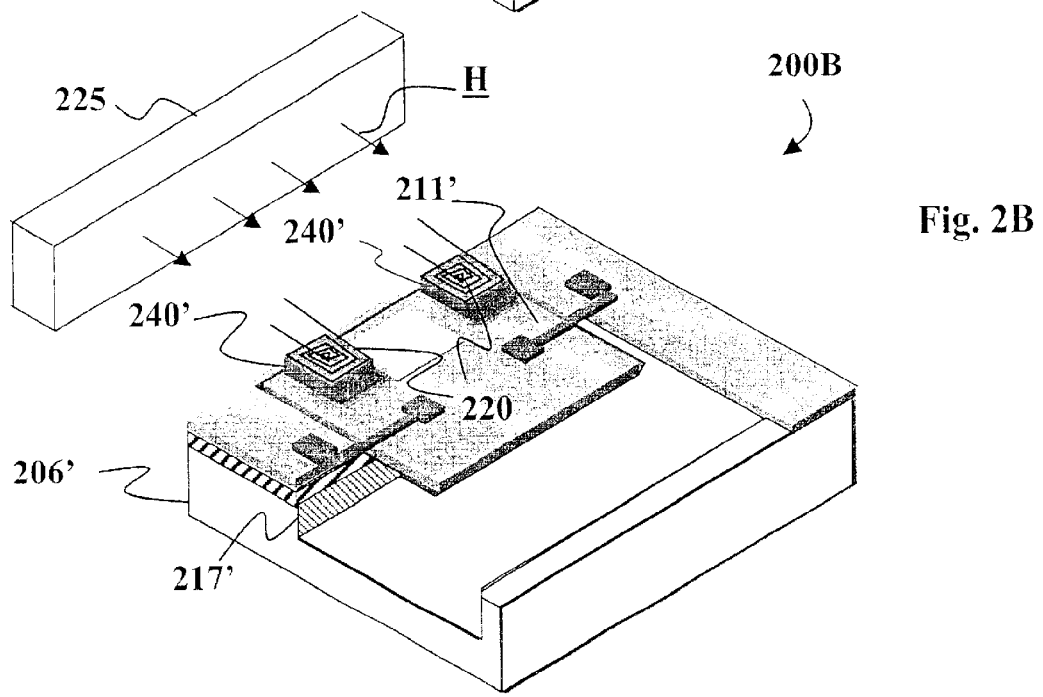
FIG. 2B is an isometric schematic drawing of a MEMS apparatus according to an alternative version of the first embodiment of the present invention.

In one configuration, shown in FIG. 2B an apparatus 200B may include a flap 211' having magnetically active element 240' that includes one or more coils 220 instead of, or in addition to, a magnetic material. The coils 220 may interact with an externally applied magnetic field H. The magnetic field H may be applied by a magnetic field source 225, which may be any suitable source of magnetic field, e.g. an external coil or permanent magnet. By way of example, FIG. 2B depicts a magnetic field that is substantially horizontal. Alternatively, the magnetic field H may have any orientation. Electric current applied through the coil 220 interacts with the external magnetic field H in a way that causes a flap 211' to move from one angular position to another with respect to a base 206'. In a particular configuration, the coil 220 may interact with a magnetic material deposited in close proximity to the flap 211'. The magnetic material may be applied to a sidewall 217' of the base 206'. The magnetic material may be applied through suitable techniques such as sputtering or electroplating. In configurations where magnetically active element 240' includes a coil 220, the polarity of current that runs through the coil 220 may be reversed to apply an opposite force to the flap 211.

By way of example, the one or more coils 220 may be fashioned by forming an insulating layer on the flap 211, etching one or more trenches in the insulating layer, e.g. in a spiral shape, and filling the one or more trenches with electrically conductive material such as aluminum or copper.

In an alternative embodiment, stiction, e.g., between the flap 211 and the base 206, may be reduced by applying a pre-bias force to the flap to move the flap at least partially out of contact with an underlying base. By way of example, the magnetically active element 240 may interact with a fixed pre-bias magnetic field. The pre-bias magnetic field may exert a force on the magnetically active material 240 that produces a biasing torque on the flap 211. The biasing torque may partially counteract a mechanical or other torque exerted on the flap 211. As a result, when the flap 211 is in the first position, it is moved slightly out of a position parallel with the plane of the base 206. Consequently, the flap 211 does not touch an underlying portion of the base 206. Thus, the effects of stiction and squeeze-film damping may be reduced.

It must be stated that a pre-bias force may be applied to a variety of movable MEMS devices, including prior-art MEMS mirrors and flaps, to move the device at least partially out of contact with an underlying base to reduce effects of stiction. Furthermore, it must be stated that the pre-bias force may be generated by several biasing elements, including but not limited to flap torsion springs, current carrying coil, gap-closing electrodes, spring loaded element, stress bearing material, piezoelectric element and thermal bimorph actuator.

The flap 211 may include a light-deflecting portion 213 so that the apparatus may be used in a planar matrix switch. Where such an apparatus is used in a planar matrix switch, it is desirable to be able to clamp the flap 211 at 2 different positions. Between these two positions, the accuracy of an ON position, e.g. where the flap 211 is vertical, is of particular importance. In a particular embodiment of the present invention, the flap 211 moves out-of-plane by magnetic actuation and is clamped in place by electrostatic attraction to an electrode. In a similar fashion, the mirror may be held in-plane by another set of electrodes or by a voltage difference between the flap 211 and the base 206.

The state or position of a flap such as the flap 211 may be sensed by one or more sensors including gap closing electrodes, capacitive, inductive, or piezoresistive elements, strain gauges, coils, magnets, optical sensors, and the like.

Figure 3A:
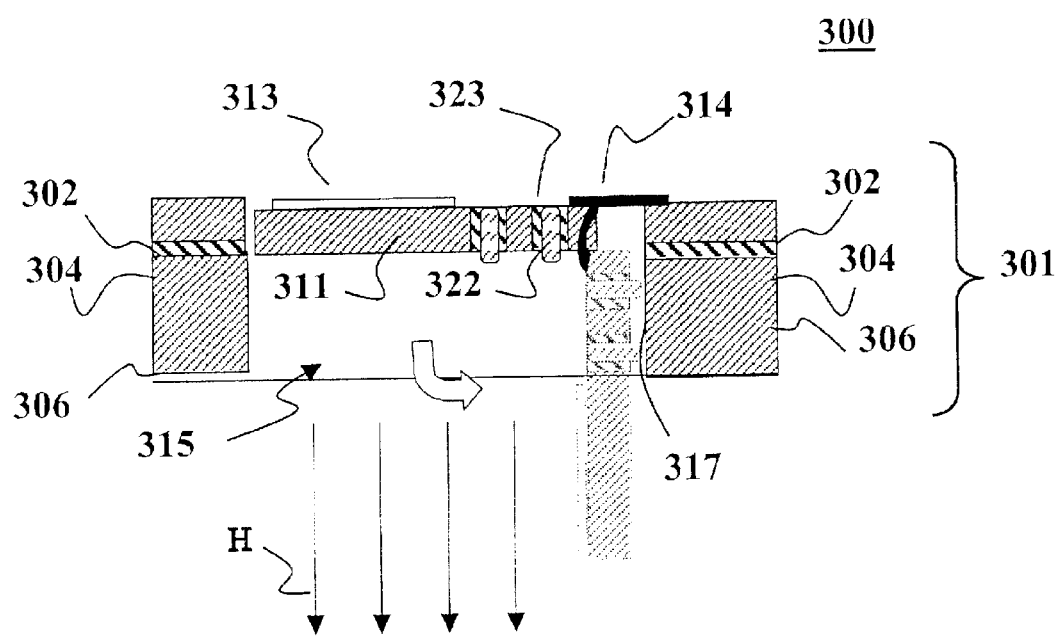
FIG. 3A depicts a simplified cross-sectional schematic diagram of a MEMS apparatus according to another alternative version of the first embodiment of the present invention.

The invention is not limited to flaps that move upwards into an "on" position. For example, an alternative embodiment of a MEMS apparatus 300 is depicted in FIG. 3A. The apparatus 300 may incorporate all the main features of the apparatus of FIG. 2. The apparatus generally includes a substrate 301 having a device layer 302, insulator layer 304 and base 306. A cavity 315 formed through the substrate 301 includes a sidewall electrode 316, and a flap 311 movably connected to the base 306 by a flexure 314. The flap 311 moves, i.e. translates and moves, downwards into the through-wafer cavity 315, e.g. under the influence of a magnetic field H.

Figure 3B:
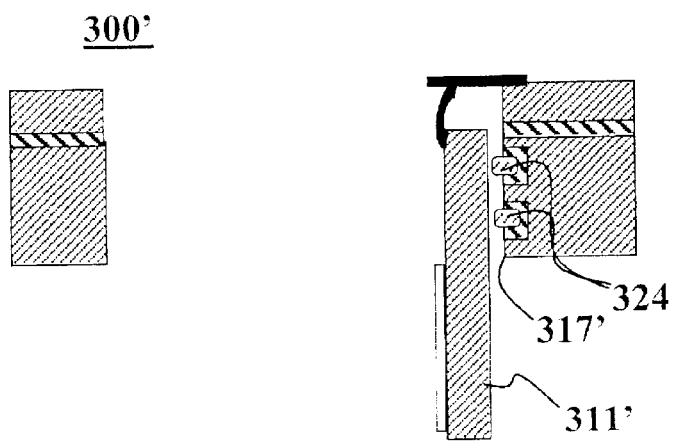
FIG. 3B depicts a simplified cross-sectional schematic diagram of a MEMS apparatus according to another alternative version of the first embodiment of the present invention.

The flap may include a reflecting or other optical element 313. The apparatus 300 may act as a mirror. The flap 311 may further include one or more electrically conductive landing pads 322 that are electrically connected to the sidewall electrode 316. The landing pads 322 may be electrically isolated from the flap 311 by an insulating material 323. By maintaining the landing pads 322 substantially equipotential to the sidewall electrode 316, stiction and arcing between the landing pads and sidewall electrode may be reduced. Alternatively, as shown in FIG. 3B an apparatus 300' of the type described above with respect to FIG. 3A may include one or more conductive sidewall landing pads 324 that are electrically isolated from a sidewall 317' and electrically coupled to a flap 311'.

The disadvantages associated with the prior art may be overcome by a process for creating an electrically isolated electrode on a sidewall of a cavity in a base. The process generally involves etching one or more trenches in a backside of a base, e.g., by anisotropic etch. The base may be a crystalline material, e.g., crystalline silicon having a <110> crystal orientation. The trench may be etched such that an orientation of the sidewall is defined by a crystal orientation of the base material. A layer of insulating material is formed on one or more sidewalls of one or more of the trenches. A conductive layer is formed on the layer of insulating material on one or more sidewalls of one or more of the trenches. Base material is removed from a portion of the base bordered by the one or more trenches to form a cavity in the base. The trenches may be defined underneath a flap that overlies the base. The trench etch may stop on an etch-stop layer so that the cavity does not form all the way through the base. The conductive layer may completely fill up the trench between the insulating materials on the sidewalls to provide the isolated electrode. Conducting material may also be deposited on the backside of the base to provide electrical connections or electrodes on that side.

Figure 4A:
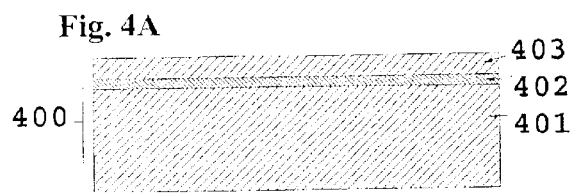
FIGS. 4A–4I depict a series of simplified cross-sectional diagrams illustrating the formation of a MEMS apparatus according to a second embodiment of the invention.
Figure 6:
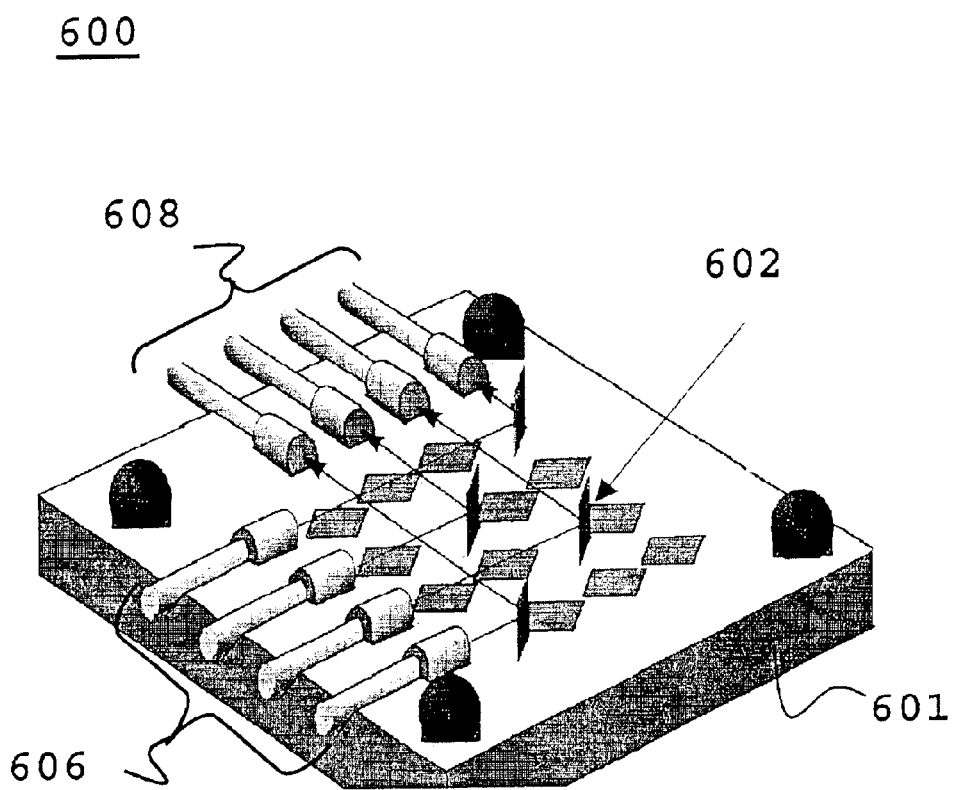
FIG. 6 depicts an optical crossbar switch that uses an array of MEMS mirrors according to a third embodiment of the present invention.

FIGS. 4A–4H depict an example of a process for fabricating a structure of the type shows in FIG. 2A, FIG. 2B, FIG. 3A or FIG. 3B. The structure is formed from a starting material wafer 400 having a device layer 403, a substrate layer 401 and an insulator layer 402 disposed between the device and substrate layers as shown in FIG. 4A. The base and/or device layer may be made of a crystalline material. For example, the starting material is typically a silicon-on-insulator (SOI) wafer with a silicon <110> handle substrate as the substrate layer 401; the device layer can be standard silicon of <100> orientation; and the insulating layer can be an oxide formed, e.g., by oxidation of a surface of the substrate layer 401. Alternatively, the starting material may be a silicon-on-nitride wafer or any other suitable type of wafer material known to the art. The device layer 403 may be used, for example to form a mirror plate for a MEMS optical switch, or an array of such switches, such as that shown in FIG. 6. In the first step FIG. 4B, two parallel deep trenches 404 that reach the buried oxide 402 may be formed in the substrate layer 401 from the backside of the wafer 400. The widths of the trenches 404 may be sufficiently narrow that they can be completely filled-in during a later step. The trenches 404 may define the periphery of a cavity 415 that may be formed to accommodate a flap similar to those described above with respect to FIGS. 2–3B. It is also possible to form a single continuous trench that defines the periphery of the cavity. The trench or trenches 405 may be etched by an anisotropic etchant like KOH with silicon nitride or silicon oxide mask (not shown for simplicity). Alternatively, the trenches 405 may be formed in the substrate layer 401 prior to bonding the device layer 403 to the substrate layer 401.

Figure 4F:
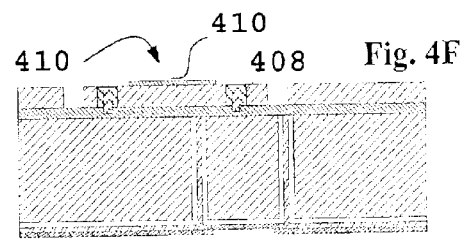
Figure 4B:
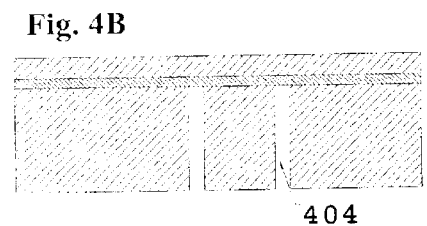
Figure 4G:
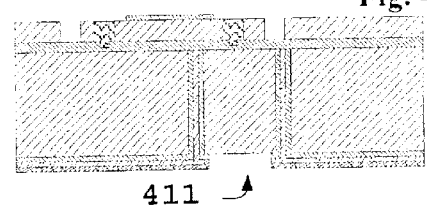
Figure 4C:
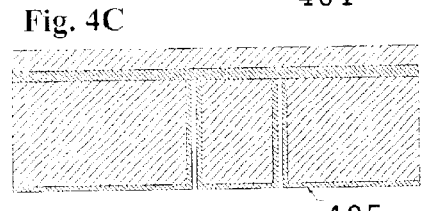
Figure 4H:
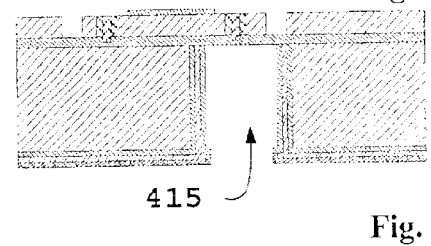
Figure 4D:
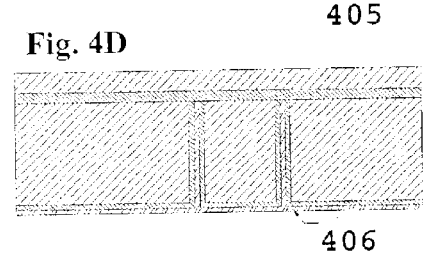

In the next step, as depicted in FIG. 4C, an insulator layer 405 may be deposited or grown that covers the interior surface of the trenches and the wafer backside. The insulator layer 405 may preferably be a conformally deposited layer (e.g. TEOS oxide, thermal oxide or silicon nitride). Next, as shown in FIG. 4D, a conformal conductive layer 406 may be deposited over the insulator layer 405 on the interior surface of the trenches 404. In a preferred implementation, the conductive layer 406 completely fills the trenches 404. The conductive layer 406 may be made of any conductive material, including, but not limited to a layer of metal or doped semiconductor material. By way of example, the conductive layer 406 may be polycrystalline silicon (polysilicon), which is a good candidate material for filling the trenches 404. Alternately, tungsten, titanium nitride, or silicon carbide may also be used. After this step, the starting material 400 is substantially free of any large or deep holes and trenches and may be compatible with additional standard wafer fabrication processes.

Figure 4I:
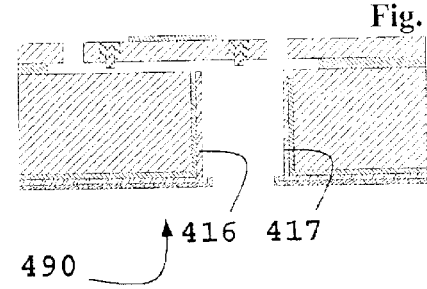
Figure 4E:
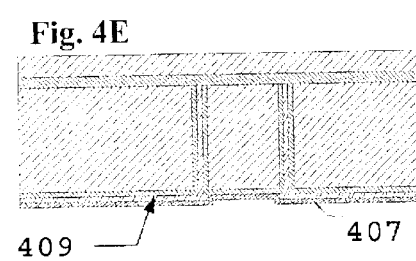

Next, as shown in FIG. 4E, the conductive layer 406 may be patterned and etched to expose the insulator 405 directly under the to-be-formed cavity. Then a protective material 407 may be deposited on both a front side (i.e. the exposed surface of the device layer 403) and a backside of the starting material 400. By way of example, the protective material 407 may be a layer of silicon nitride. A layer of silicon nitride can serve as an etching mask on the backside 409 of the starting material 400 (i.e., the exposed surface of the substrate layer 401) in a later step. Silicon nitride can also be used as an insulator for the front side of MEMS structures. Alternately, silicon dioxide or a polymer may also be used as the protective material 407.

Next, a hinged flap 410 may be formed from the top device layer 403 as shown in FIG. 4F. The flap may optionally contain landing pads 408 on its bottom surface to minimize contact area with the base or sidewall and to provide electrical isolation as described above. The flap 410 may be mechanically connected to the base through a flexure or torsional beam similar to those depicted and described with respect to FIG. 2A, allowing the flap 410 to move out of the plane of the base. A reflecting surface 410 may be formed on the surface of the flap 410 so that the resulting device may function as a mirror.

Electrically isolated conductive landing pads 422 may be s formed on an underside of the flap 410. For example vias may be etched through the flap into the oxide 402. The vias may then be partially or completely filled with insulating material. The vias may then be filled with conductive material.

Up to this point the starting material 400 is free of deep holes. As a result, the starting material 400 is compatible with standard wafer fabrication processes and is robust and less likely to be damaged during handling and processing.

At this point a cavity containing a clamping electrode and mechanical stop has been defined. In the next step, as shown in FIG. 4G, the backside masking layer (protective layer 407) may be patterned and an opening 411 may be etched through the backside insulator 405 to expose the surface of the base 401. In the following step, as shown in FIG. 4H, a selective etch process that does not attack the insulator materials (405 and 407) may be used remove the bulk silicon and forms a cavity 415 having sidewalls 416. During this step, the conductive material 406 can be well protected by the insulator materials 405 and 407 and stays intact. The conductive material 406 that filled the trenches 404 forms sidewall electrodes 417 that are electrically insulated by the material of layer 407.

The bulk material from the base 401 may be removed by any suitable etch process. For example an anisotropic etch, using an etchant such as KOH or other anisotropic etchant (e.g., EDP,etc) may be used. Alternatively, an isotropic silicon etch (e.g., a mixture of Nitric acid, Hydrofluoric acid, Acetic acid, and water) may be used. Furthermore, a vapor etch, e.g. using $XeF_2$ or $SF_6$ vapor may be used to etch out the bulk silicon material to form the cavity 415. Finally, a sacrificial etch may remove selected portions of insulator layers 405 and 402 to release the flap 410, and form a completed MEMS device 490 as shown in FIG. 4I. The flap may still be attached to the rest of the device layer 403 and to the base 401 by one or more flexures similar to those shown and described above with respect to FIG. 2A. Preferably, the flexures are sufficiently flexible to permit the mirror plate to move out of the plane of the base.

FIG. 4I shows that the sacrificial layer 402 is completely removed from beneath the flap 410. However, in an isotropic etch process, the sacrificial layer 402 may be only partially removed from beneath the other portions of the device layer 403 leaving them undercut. The amount of undercut may be controlled, e.g. by the timing of the etch process. Alternatively, an etch stop material may be used to limit the undercut.

Figure 5A:
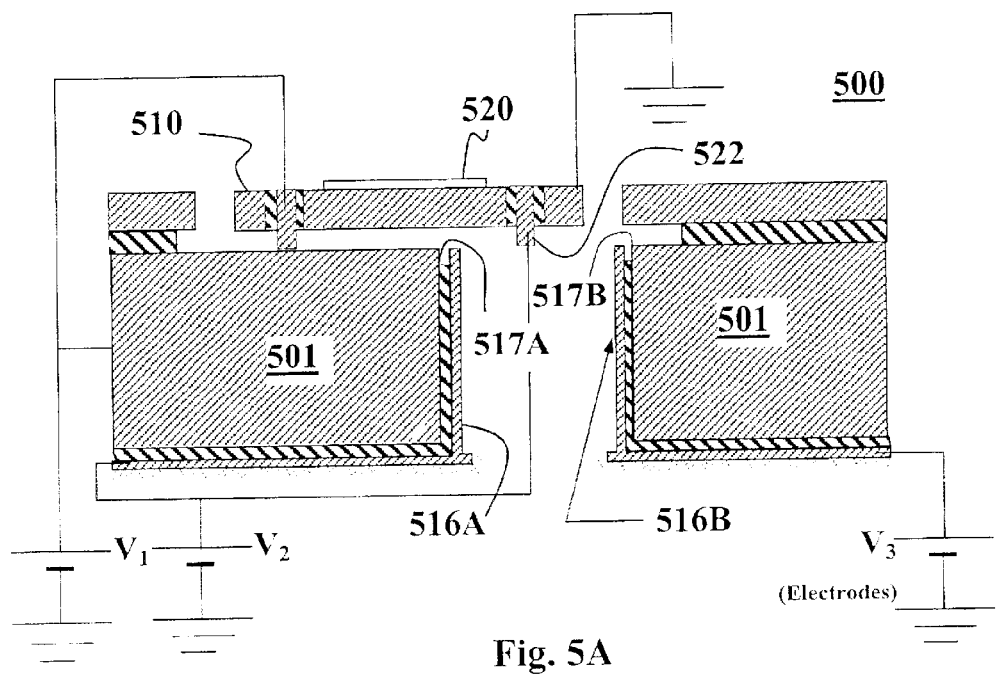
FIG. 5 is a simplified cross-sectional diagram depicting a portion of the apparatus of FIG. 4I.

FIG. 5A depicts a cross-sectional schematic diagram of the device 500 that has been fabricated according to a process of the type depicted in FIGS. 4A–4I. FIG. 5A shows the advantages of this process. The device 500 has a base 501 with a cavity 515. The device 500 includes a flap 510 that is free to move with respect to a plane of the base 501. The flap 510 may include a reflecting element 520. The device 500 includes sidewall electrodes 517A, 517B that may be electrically isolated from the base 501. Voltage sources $V_1$, $V_2$, $V_3$, can apply independent potentials to the base 501 and electrodes 516A, 516B respectively. The base 501 may also be regarded as an electrode if it is electrically conducting. Alternatively, an electrically isolated electrode (not shown) may be used to clamp the flap 510 to the base when it is in a substantially horizontal position. The voltage sources $V_1$, $V_2$, $V_3$ produce electric fields between the flap 510 and the base 501 or sidewall electrode 516A that can clamp or release the flap 510 independently. This may be an important feature for MEMS mirror actuation. Moreover, the sidewall electrodes 516A, 516B on opposite sidewalls 517A, 517B of the cavity 515 can also be electrically isolated from each other by patterning the backside conductor 506 to define separate leads to each electrode 516A, 516B.

The device 500 may include one or more conductive landing pads 522 that may be used to reduce stiction between the flap 510 and the sidewall 517A or the base 501. Such landing pads 522 may be electrically isolated from the flap 510, e.g., by an insulating material, and electrically coupled to a landing surface, e.g., either the base 501 or the sidewall 517A. The electrical connection may be maintained in various configurations, including those where the conductive landing pads 522 are substantially the same electric potential as the landing surface. This reduces the risk of arcing that can damage the landing surface or microweld the flap to the landing surface. The base 501 may therefore serve as an independent electrode for clamping the flap 510 in a position parallel to the plane of the base 501.

Figure 5B:
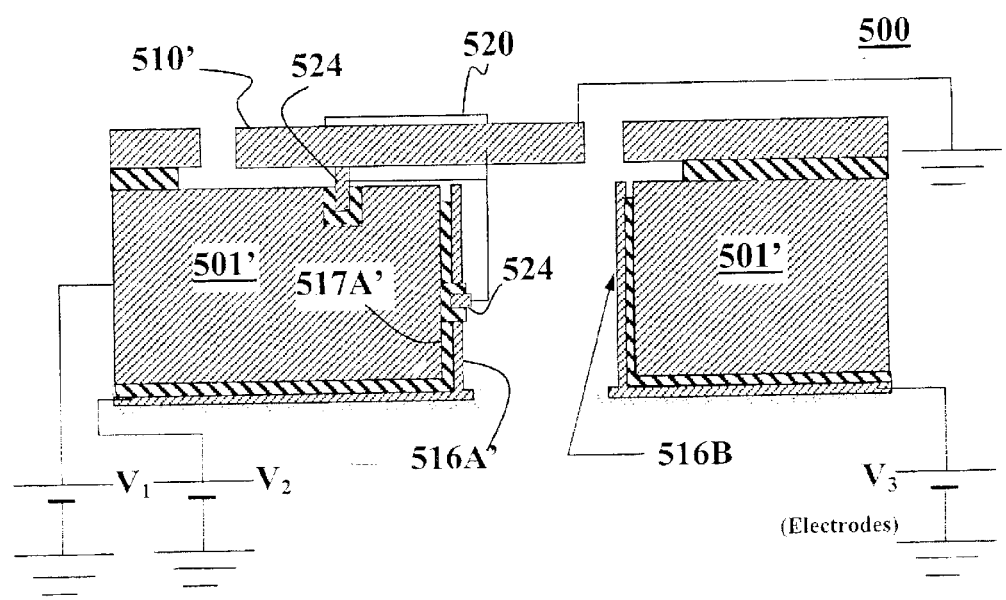

Alternatively, as shown in FIG. 5B, a device 500', of the type described with respect to FIG. 5A, may achieve the same result by including one or more landing pads 524 on a base 501' and/or sidewall 517A' that are electrically isolated from the base 501' and a sidewall electrode 516A' yet may be electrically connected to flap 510'. The base 501' may therefore serve as an independent electrode for clamping the flap 510' in a position parallel to the plane of the base 501'.

The present invention includes systems that incorporate two or more MEMS apparatus, e.g. arranged in an array. Such an array is depicted in the crossbar switch 600 of FIG. 6. The switch 600 generally comprises an array of MEMS mirrors 602 of having features in common with MEMS devices of one or more of the types depicted in FIGS. 2A–2B, FIG. 3 or FIG. 5. Specifically, each mirror 602 includes a flap having a portion coupled to a base 601 so that the flap is movable out of the plane of the base 601 from a first angular orientation to a second angular orientation. Each flap may contain a light deflective element. The base 601 has one or more openings to receive one or more flaps. Each opening has largely vertical sidewalls. The sidewalls contact a portion of the flap such that the flap assumes an orientation substantially parallel to that of the sidewall when the flap is in the second angular orientation. The sidewalls may contain one or more electrodes for clamping the mirrors 602 against the sidewalls. The mirrors 602 couple optical signals 604 between one or more input fibers 606 and one or more output fibers 608. Although the mirrors 602 depicted in the apparatus of FIG. 6 tilt up to deflect the light, those skilled the art will recognize that the mirrors may alternatively tilt downwards in a manner similar to that depicted in FIG. 3.

In accordance with the foregoing, low-cost, high yield scalable switches may be provided without the disadvantages attendant to a two-chip design. It will be clear to one skilled in the art that the above embodiment may be altered in many ways without departing from the scope of the invention.

What is claimed is:

1. A microelectromechanical apparatus comprising:
   a base;
   a flap having a portion coupled to the base so that the flap is movable out of the plane of the base from a first angular orientation to a second angular orientation;
   wherein the base has an opening that receives the flap when the flap is in the second angular orientation, the opening having one or more sidewalls, wherein at least one of the sidewalls contacts a portion of the flap such that the flap assumes an orientation substantially parallel to that of the sidewall when the flap is in the second angular orientation; and
   a sidewall electrode disposed in one or more of the sidewalls.

2. The microelectromechanical apparatus of claim 1 wherein the flap further comprises a magnetically active element.

3. The microelectromechanical apparatus of claim 2 wherein the magnetically active element is a magnetic material.

4. The microelectromechanical apparatus of claim 2 wherein the magnetically active element is a coil.

5. The microelectromechanical apparatus of claim 2 further comprising an external magnet.

6. The apparatus of claim 1 wherein the flap is connected to the base by one or more flexures.

7. The apparatus of claim 6 wherein at least one flexure is electrically conductive.

8. The microelectromechanical apparatus of claim 1 further comprising a light-deflecting element disposed on the flap.

9. The microelectromechanical apparatus of claim 1, wherein the sidewall electrode is electrically isolated from the base.

10. The microelectromechanical apparatus of claim 1 further comprising:
   a voltage source coupled between the flap and the sidewall electrode to apply an electrostatic force between the sidewall electrode and the flap.

11. The apparatus of claim 10 wherein the flap contains a magnetically active material and the electrostatic force between the sidewall electrode and the flap is sufficient to prevent the flap from changing position in the presence of an applied magnetic field.

12. The apparatus of claim 1 further comprising:
   an electrode disposed on the base; and
   a voltage source coupled between the electrode in the base and the flap to apply an electrostatic force between the electrode in the base and the flap.

13. The apparatus of claims 1 where the base is made from a substrate portion of an SOI (silicon-on-insulator) wafer and the flap is defined from a device layer portion of the SOI wafer.

14. The apparatus of claim 6 wherein the one or more flexures include one or more torsional beams.

15. The apparatus of claim 1, further comprising one or more conductive landing pads disposed on an underside of the flap wherein the one or more conductive landing pads are electrically isolated from the flap.

16. The apparatus of claim 15, wherein one or more of the conductive landing pads are electrically coupled to a sidewall electrode.

17. The apparatus of claim 15 wherein one or more of the conductive landing pads is electrically coupled to the base.

18. The apparatus of claim 1 wherein the sidewall includes a sidewall electrode and one or more conductive landing pads that are electrically isolated from the sidewall electrode.

19. The apparatus of claim 18 wherein one or more of the landing pads are electrically coupled to the flap.

20. The apparatus of claim 18 wherein the sidewall electrode is electrically isolated from the base.

21. An array of one or more structures, wherein each structure comprises:
   a base;
   a flap having a portion coupled to the base so that the flap is movable out of the plane of the base from a first angular orientation to a second angular orientation, the flap containing a reflecting element;
   wherein the base has an opening with largely vertical sidewalls, at least one of the sidewalls containing an electrode, wherein the sidewalls contact a portion of the flap such that the flap assumes an orientation substantially parallel to that of the sidewall when the flap is in the second angular orientation.

22. An array of claim 21 wherein one or more of the structures includes a sidewall electrode disposed in one or more of the sidewalls.

23. The array of claim 21, wherein the sidewall electrode is electrically isolated from the base.

24. An array of claim 21 wherein the array forms an optical switch.

* * * * *